US012438105B2

(12) United States Patent
Lai et al.

(10) Patent No.: US 12,438,105 B2
(45) Date of Patent: Oct. 7, 2025

(54) SEAL RING STRUCTURE AND METHOD OF FABRICATING THE SAME

(71) Applicant: Taiwan Semiconductor Manufacturing Company, Ltd., Hsin-Chu (TW)

(72) Inventors: Yen Lian Lai, New Taipei (TW); Chun Yu Chen, Hsinchu (TW); Yen-Sen Wang, Hsinchu (TW); Chung-Yi Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 499 days.

(21) Appl. No.: 17/737,646

(22) Filed: May 5, 2022

(65) Prior Publication Data

US 2023/0035217 A1 Feb. 2, 2023

Related U.S. Application Data

(60) Provisional application No. 63/227,254, filed on Jul. 29, 2021.

(51) Int. Cl.

| | |
|---|---|
| ***H01L 23/58*** | (2006.01) |
| ***H01L 23/522*** | (2006.01) |
| ***H01L 23/528*** | (2006.01) |

(52) U.S. Cl.
CPC ........ *H01L 23/585* (2013.01); *H01L 23/5226* (2013.01); *H01L 23/528* (2013.01)

(58) Field of Classification Search
CPC . H01L 23/528; H01L 27/0207; H01L 23/562; H01L 21/78; H01L 23/585; H01L 23/60; H01L 23/62; H01L 23/64; H01L 23/66; H01L 23/5226
See application file for complete search history.

(56) References Cited

U.S. PATENT DOCUMENTS

| | | | |
|---|---|---|---|
| 8,729,705 B2 | 5/2014 | Wang et al. | |
| 9,627,332 B1 * | 4/2017 | Liang | H01L 23/585 |
| 9,650,243 B2 | 5/2017 | Chen et al. | |
| 10,727,218 B2 | 7/2020 | Wu et al. | |

(Continued)

FOREIGN PATENT DOCUMENTS

| | | |
|---|---|---|
| TW | 202117828 A | 5/2021 |

*Primary Examiner* — Galina G Yushina
(74) *Attorney, Agent, or Firm* — HAYNES AND BOONE, LLP

(57) ABSTRACT

A semiconductor structure includes a substrate; a seal ring region around a circuit region over the substrate, wherein the seal ring region includes a sealing region and a transition region, and wherein the transition region is disposed between the sealing region and the circuit region; and a stack of metal layers disposed over the circuit region, the transition region and the sealing region. A metal layer of the stack of metal layers includes metal seal rings disposed in the sealing region including a first section along a first direction and a second section along a second direction, wherein the second direction is substantially perpendicular to the first direction; and metal transition lines disposed in the transition region along the first section and the second section, wherein the metal transition lines are oriented lengthwise along the first direction.

20 Claims, 17 Drawing Sheets

(56) References Cited

U.S. PATENT DOCUMENTS

2007/0069336 A1* 3/2007 Ning .................... H01L 23/585
257/619
2011/0266679 A1* 11/2011 Hotta .................... H01L 23/585
257/E21.585
2012/0038028 A1* 2/2012 Yaung .................... H01L 21/78
257/E23.18
2015/0255593 A1* 9/2015 Yu .................... H01L 29/6681
257/401
2019/0067216 A1* 2/2019 Zhu .................... H01L 23/585
2022/0037521 A1* 2/2022 You .................... H01L 29/66439

* cited by examiner

SEAL RING STRUCTURE AND METHOD OF FABRICATING THE SAME

PRIORITY

This application claims the benefit to U.S. Provisional Application Ser. No. 63/227,254 filed Jul. 29, 2021, the entire disclosures of which is incorporated herein by reference.

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each circuit die. This seal ring is formed during fabrication of the many layers that comprise the circuits, including both the front-end-of-line (FEOL) processing, the middle-end-of-line (MEOL) structures, and back-end-of-line processing (BEOL). The FEOL and MEOL include forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, the property differences between the seal ring region and the circuit region, such as the differences in pattern densities and/or pattern sizes, may cause processing issues. Examples of such processing issues include dishing in subsequent chemical mechanical planarization (CMP) processes and/or over etching in subsequent etching processes. For at least these reasons, improvements are needed to solve the processing issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
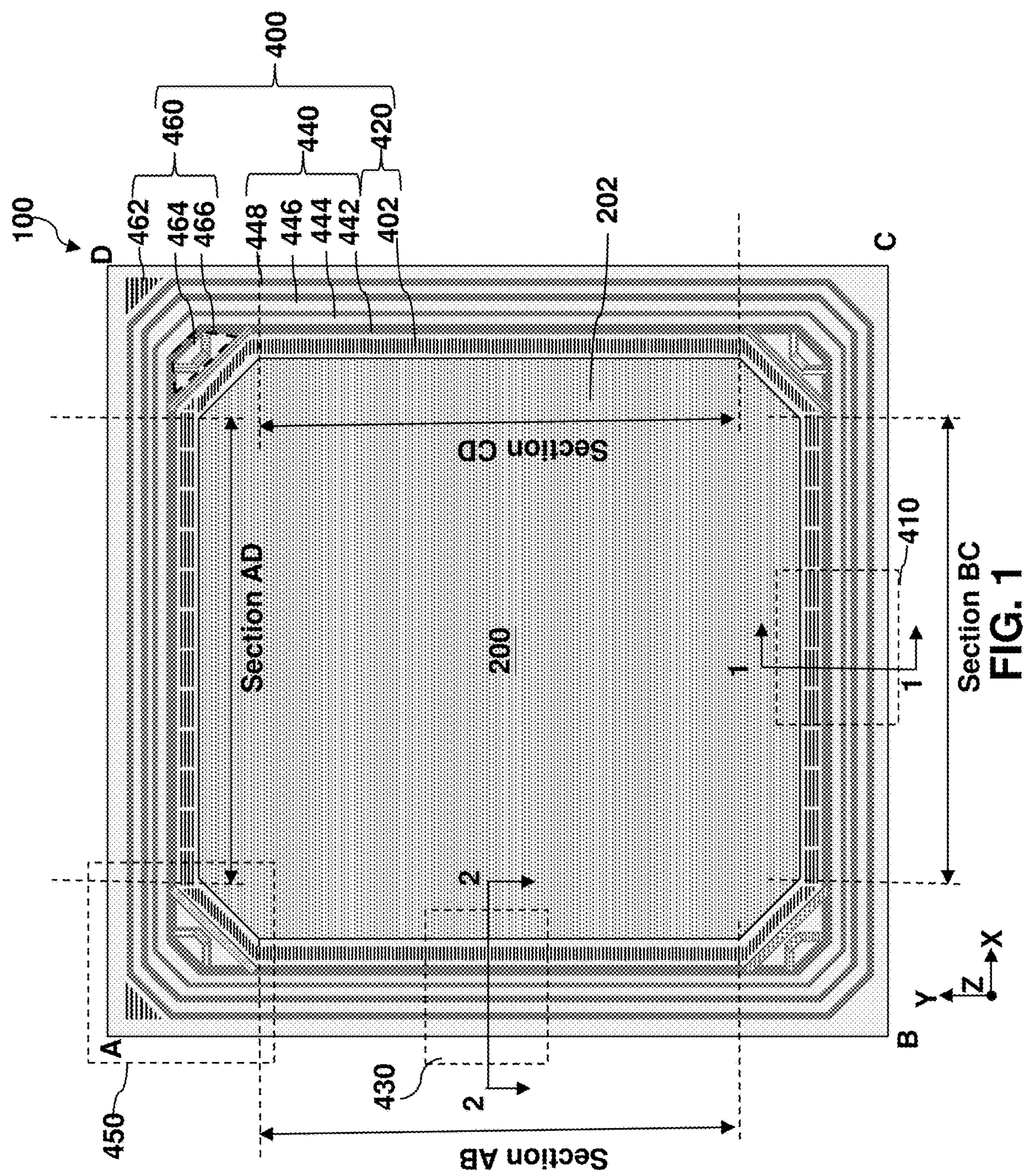
FIG. 1 is a top plan view of a semiconductor structure with a seal ring region according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The seal ring structure includes multiple layers and vertically extends from the substrate, through an interconnect structure, and up to the passivation layer. The seal ring structure may be formed simultaneously with the circuit features in circuit area (or chip area, device area, chip die) in the front-end-of-line (FEOL) structures, the middle-end-of-line (MEOL) structures, and/or in back-end-of-line (BEOL) structures. As used herein, FEOL structures include structural features of transistors or other semiconductor devices fabricated on a semiconductor substrate; MEOL structures include source/drain contact vias or gate contact vias; and BEOL structure include interconnect structures and passivation structures over the interconnect structures.

In the BEOL processes, conductive lines or vias are formed in multiple metal layers stacked over the semiconductor substrate to connect various features in the circuit region. Simultaneously, conductive rings and via rings are formed in the seal ring region of each metal layer. However, the conductive rings and the via rings in the seal ring region do not provide electrical functions for the semiconductor structure as the conductive lines and vias in the device region do. Instead, the conductive rings and via rings in the seal ring region encloses and protects the circuit area from moisture, mechanical stress, or other defect-generating mechanism. The differences in functionality cause the seal ring region to have properties different from the circuit region, such as pattern sizes and/or pattern density. The differences in properties may cause processing issues such as over etching in etching processes and/or dishing in chemical mechanical planarization (CMP) processes, especially in a region between the seal ring region and the circuit region.

This application generally relates to a semiconductor structure and fabrication processes thereof, and more particularly to a seal ring region of the semiconductor structure and the fabrication processes thereof. The seal ring region includes various sub-regions configured differently in a same layer and varying differently through multiple layers, as described below in detail. The seal ring region of the semiconductor structure includes a sealing region and a transition region. The transition region separates the sealing region from the circuit region. The transition region does not serve as active electronic components. Instead, the transition region is designed to have proper properties (e.g., proper line widths, line pitches, and/or line pattern density) that help buffering the differences between the circuit region and the seal ring region, thereby providing smooth transition from the circuit region to the seal region. The smooth transition alleviates process issues such as dishing during the subsequent CMP processes and/or uneven etching during the subsequent etching processes. Those of ordinary skill in the art should appreciate that they may readily use the present disclosure as a basis for designing or modifying other processes and structures for carrying out the same purposes and/or achieving the same advantages of the embodiments introduced herein.

FIG. 1 is a top plan view of the semiconductor structure 100 according to an embodiment of the present disclosure. The semiconductor structure 100 (such as a manufactured wafer or a part thereof) includes a seal ring region 400 that encloses a circuit region (or device region, IC die, chip area) 200 from a top view. The seal ring region 400 and the circuit region 200 are disposed over a substrate and in multiple metal layers stacked thereover along z-direction. The seal ring region 400 has a rectangular or substantially rectangular periphery fully surrounding the circuit region 200. The four corners A, B, C, and D of the rectangular periphery are replaced by four sloped corner lines that connects the adjacent sections AB, BC, CD, and AD of the seal ring region 400. In the present embodiment, the seal ring region 400 includes transition region 420, sealing region 440, and four corner regions 460.

The sealing region 440 may include multiple concentric seal rings. In the present embodiments, the sealing region 440 includes concentric seal rings 442, 444, 446, and 448 disposed substantially parallel to each other, each of which extends fully around and completely encloses the circuit region 200. The seal ring 442 encloses the circuit region 200, the seal ring 444 encloses the seal ring 442, the seal ring 446 encloses the seal ring 444, and the seal ring 448 encloses the seal ring 446. The nested seal rings 442, 444, 446, and 448 protect the circuit region 200 from damages such as dust, moisture, mechanical stress, and/or other degradation mechanisms. Each of the seal rings 442, 444, 446, and 448 includes conductive lines and vias disposed in each of the metal layers stacked over the substrate. The conductive lines and vias may each include copper (Cu), titanium nitride (TiN), tungsten (W), ruthenium (Ru), other suitable conductive material or a combination thereof.

The transition region 420 is disposed between the sealing region 440 and the circuit region 200. The transition region 420 includes transition lines 402 parallel to each other and distributed around the entire circuit region 200. The transition lines 402 may each include copper (Cu), titanium nitride (TiN), tungsten (W), ruthenium (Ru), other suitable conductive material or a combination thereof. The circuit region 200 and the sealing region 440 have different properties although they may have similar components (fins, gates, epitaxial features, conductive lines etc.), such as sizes of the components, pattern density, line width, line pitch, and/or other properties. The differences in properties may lead to processing issues such as dishing in subsequent CMP processes and over etching in subsequent etching processes. To solve or improve such issues, the properties of the transition region 420, such as line width, line pitch, and/or pattern density, are designed to be greater than their counterparts in the circuit region but less than their counterparts in the seal ring region.

Each of the four corner regions 460 is disposed adjacent to the corresponding sloped corner lines of the seal ring region 400. The sealing region 440 divides the corner regions 460 into outer corners 462 outside the sealing region 440 and the inner corner regions 464 and 466 inside the sealing region 440. The outer corner regions 462 and the inner corner regions 464 and 466 provide further mechanical strength for the seal ring region 400. The corner regions 460 may include various conductive lines as discussed in detail below in accordance with FIGS. 7, 12, and 13.

The circuit region 200 includes sectional conducive lines 202 in the BEOL structures. In the present embodiments, the sectional conductive lines 202 are straight parallel lines disposed lengthwise along x direction. The conductive lines 202 may be disposed lengthwise along y direction in alternative embodiments as discussed in detail with respect to FIGS. 10-13. The exact functionality and/or configuration of the circuit region 200 is not limited by the present disclosure.

In the disclosed embodiment, the conductive lines 202 in the circuit region 200 are portions of the interconnect structure. The interconnect structure includes metal lines distributed in a plurality of metal layers, vias disposed between the adjacent metal layers to provide vertical routing.

Seal rings and transition lines are conductive features and are vertically extending from the substrate, through the interconnect structure, and up to the passivation layer. However, conductive lines 202 in the circuit region 200, transition lines 402 in the transition region 420, and seal rings (such as 442, 444, 446 and 448) in the sealing regions 440 are designed differently. For example, the conductive lines 202 in the circuit region 200 in the $n^{th}$ metal layer $M_n$ and the conductive lines 202 in the $(n+1)^{th}$ metal layer M (n+1) are substantially perpendicular. The transition lines 402 in the $n^{th}$ metal layer $M_n$ are oriented in parallel with the conductive lines 202 in the $n^{th}$ metal layer $M_n$; and the transition lines 402 in the $(n+1)^{th}$ metal layer $M_{(n+1)}$ are oriented in parallel with the conductive lines 202 in the $(n+1)^{th}$ metal layer $M_{(n+1)}$ to provide proper transition from the circuit region 200 to the seal ring region 400. In contrast, the seal rings (such as 442, 444, 446 and 448) maintain their orientations through various metal layers and are in parallel with the adjacent edge of the chip. For example, the segments of the seal rings associated with the chip edge AB are in parallel with the chip edge AB, the segments of the seal rings associated with the chip edge BC are in parallel with the chip edge BC, and so on.

Figure 2:
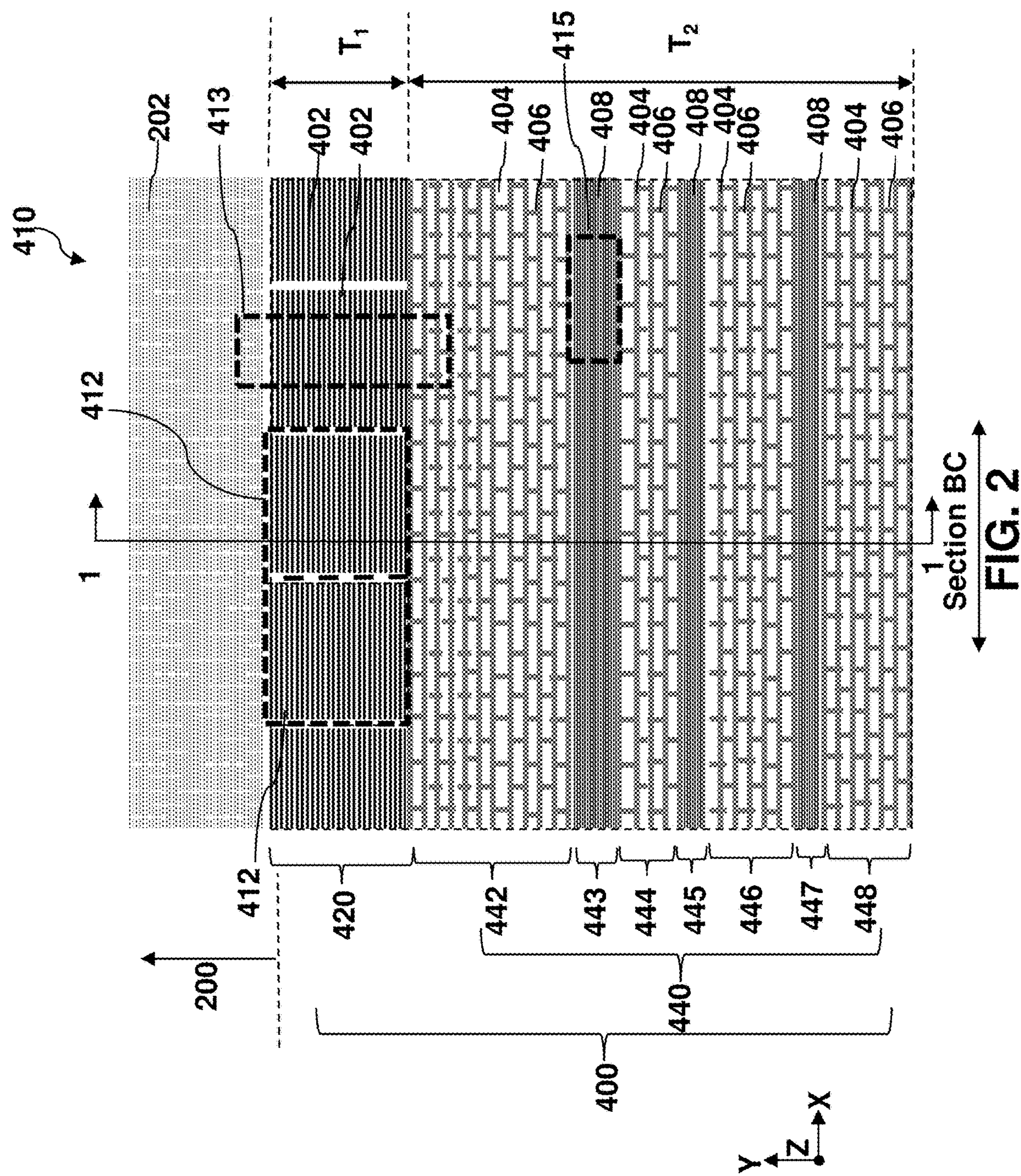
FIGS. 2 and 10 are enlarged top plan views of area 410 in FIG. 1, according to various aspects of the present disclosure.

FIG. 2 is an enlarged top plan view of the area 410 shown in FIG. 1. The area 410 is selected from the section BC of the seal ring region 400 for illustration purposes. The same principles apply to the section AD equally except that the section AD is a mirrored image of the section BC along a center line of the semiconductor structure 100 along x direction. The seal rings 442, 444, 446, and 448 in section BC of the seal ring region 400 lengthwise extend along x direction. Each of the seal rings 442, 444, 446, and 448 includes metal rings 404 disposed lengthwise along x direction in the section BC. The metal rings 404 are connected by the conductive bars (or metal bars) 406 disposed lengthwise along y direction between the metal rings 404. The interconnected metal rings 404 and conductive bars 406 increase the mechanical strength of the seal rings 442, 444, 446, and 448. The seal rings 442, 444, 446, and 448 are separated from each other by seal ring gap regions (SRG regions) 443, 445 and 447 so that the outer seal rings can stop the propagation of cracking and thus protect inner seal rings. For example, in the case that the outer seal ring 448 is damaged by cracking, the seal ring gap region between the seal ring 448 and the seal ring 446 can prevent the crack from propagating to the seal rings 446, 444, and 442. Therefore, leaving the inner seal rings 446, 444, and 442 intact to protect the circuit region 200. In the present embodiments, the seal ring region 400 further includes metal rings 408 (also be referred to as property enhancing rings (PERs) 408) disposed in the SRG regions 443, 445 and 447 between the seal rings 442, 444, 446, and 448. The PERs are further discussed in detail, such as in FIG. 3C.

The transition region 420 is disposed between the sealing region 440 and the circuit region 200. A thickness $T_1$ of the transition region 420 is different from (e.g., less than) a thickness $T_2$ of the sealing region 440. The thicknesses $T_1$ and $T_2$ are measured along a direction substantially perpendicular to the lengthwise direction of the seal ring. In one example, the thickness $T_1$ is about 20% to 50% of the thickness $T_2$. The thickness $T_1$ is proportional to the property (e.g., pattern density) differences between the sealing region 440 and the circuit region 200. For example, the greater the differences, the greater the thickness $T_1$ is adopted to transit between the sealing region 440 to the circuit region 200 to avoid processing issues.

Figure 3A:
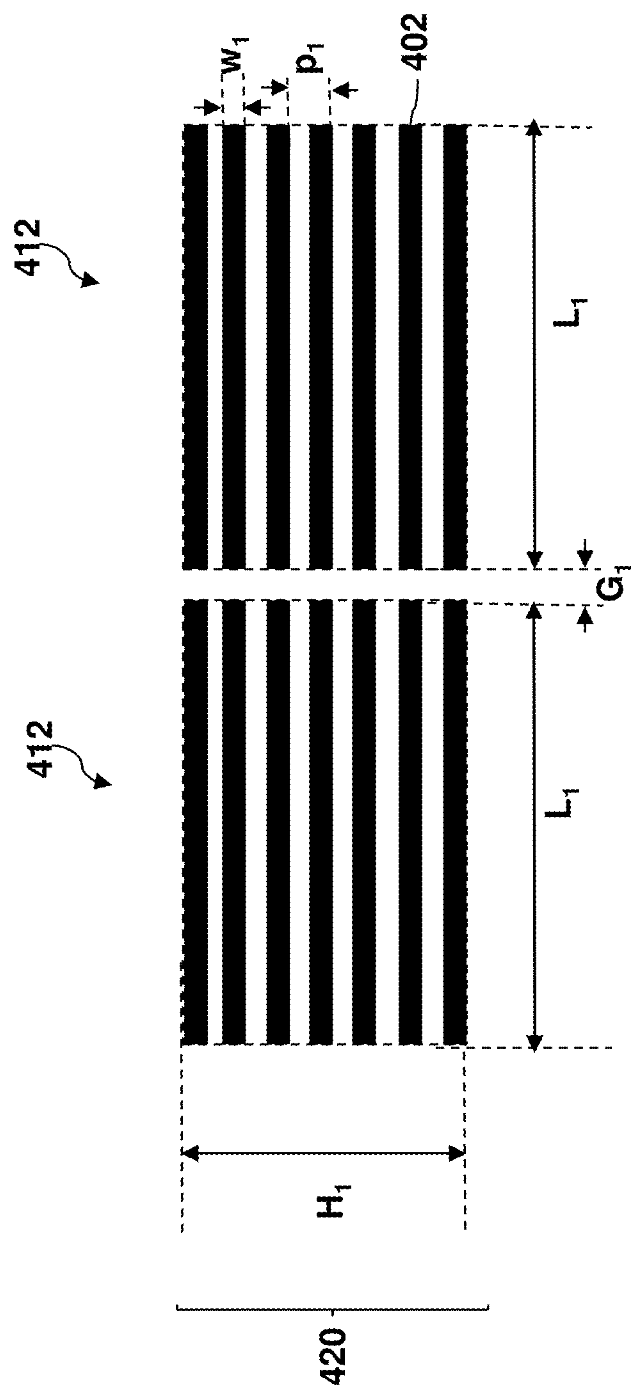
FIGS. 3A and 3B are enlarged top plan views of area 412 in FIG. 2, according to various embodiments of the present disclosure.
Figure 3B:
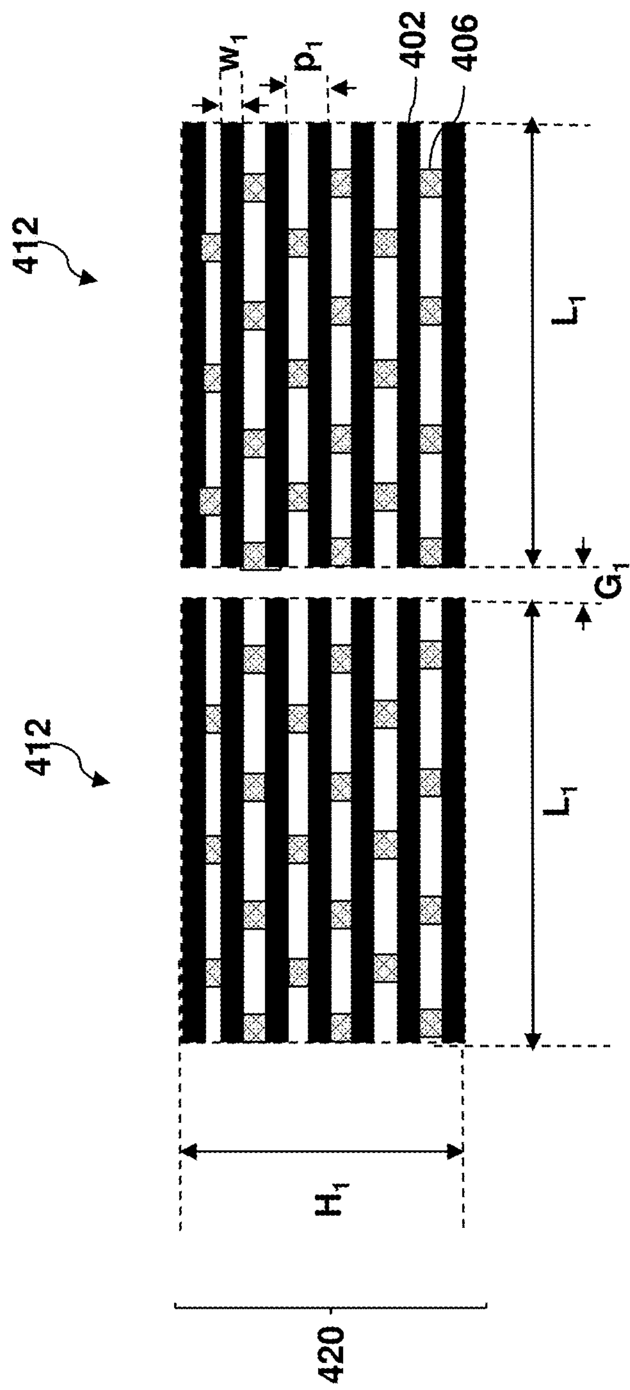

FIGS. 3A and 3B are enlarged top plan views of rectangular areas (or rectangular units) 412 in FIG. 2, according to various embodiments of the present disclosure. Referring to FIG. 3A, the transition region 420 includes transition lines 402 disposed in rectangular areas 412 in the section BC of the seal ring region 400. The rectangular units 412 may have various sizes and various length to width ratios, designed to enhance fabrication and circuit performance. In the present embodiments, the rectangular units 412 have a uniform size and a uniform length to width ratio in the section BC of the seal ring region 400. The uniform size and the uniform length to width ratio are defined by a length $L_1$ and a height $H_1$ as shown in FIG. 3A. Adjacent rectangular units 412 are aligned along x direction and spaced apart by a gap $G_1$. Bottommost transition lines 402 in the rectangular units 412 have a same distance to the seal ring 442 in the section BC of the seal ring region 400. The length $L_1$ and the height $H_1$ are designed according to the property requirements of the transition region 420, such as the pattern density requirement. Each of the rectangular units 412 includes a plurality of transition lines 402. The transition lines 402 in each of the rectangular units 412 may be straight conductive lines that have various line widths and configured in various line pitches. In the present embodiments, the transition lines 402 in each of the rectangular units 412 include a same line width $w_1$ and a same line pitch $p_1$ (FIG. 3A). A pitch of the lines is defined as a dimension between adjacent lines (such as from an edge of one line to the same edge of the adjacent line).

FIG. 3B illustrates the transition region 420 including transition lines 402 disposed in rectangular units 412 in the section BC of the seal ring region 400, constructed in accordance with other embodiments. The transition region 420 in FIG. 3B is similar to the transition region 420 in FIG. 3A. The descriptions of the similar features are not repeated for simplicity. However, the transition region 420 in FIG. 3B further include metal bars added among the transition lines 402. For examples, the metal bars 406 are configured to connect adjacent transition lines 402. The metal bars 406 may be configured such that metal bars 406 in adjacent rows are interdigitated or alternatively aligned. The added metal bars 406 can effectively tune the pattern density to improve pattern uniformity, thereby eliminating or reducing fabrication defects. For example, the fabrication method to form those conductive features may include plating. The uniform pattern density can effectively improve plating uniformity and reduce plating defect. The dimensions, such width and pitch, of the metal bars 406 in the transition region 420 provide more freedom to tune the pattern density and can be used to tune the pattern density in the transition region 420. For example, increasing the width and decreasing the pitch of the metal bars 406 can increase the pattern density.

Figure 3C:
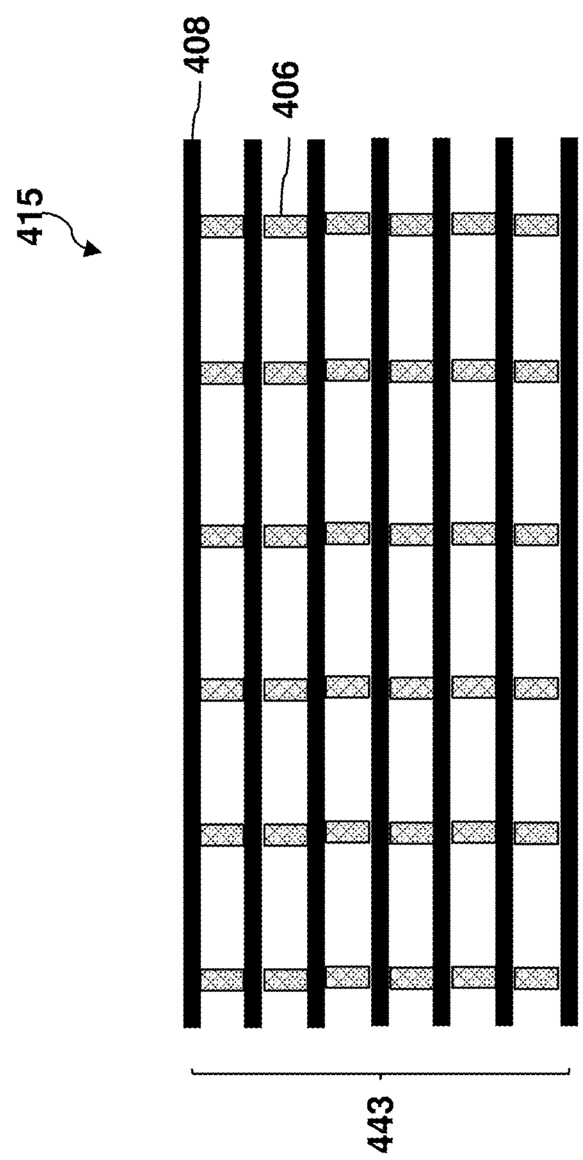
FIG. 3C is an enlarged top plan view of area 415 in FIG. 2, according to various aspects of the present disclosure.

FIG. 3C is an enlarged top plan view of area 415 in FIG. 2, according to various aspects of the present disclosure. Referring to FIG. 3C, the SRG region 443 (or 445 or 447) includes PERs 408 disposed in the rectangular area 415 in the section BC of the seal ring region 400. In the described embodiment, the PERs 408 are straight lines oriented along the x-direction. PERs 408 are different from seal rings (442, 444, 446 or 448) in term of width and pitch. For example, the PERs 408 includes a width less than the width of the seal rings. In another example, the PERs 408 includes a pitch less than the pitch of the seal rings. In some embodiments, the SRG region 443 further includes metal bars 406 added among the PERs 408. For examples, the metal bars 406 are configured to connect adjacent metal lines 408. The metal bars 406 may be configured such that metal bars 406 in adjacent rows are interdigitated or alternatively aligned. Similarly, the metal bars 406 added in the SRG region 443 can effectively tune the pattern density to improve pattern uniformity, thereby eliminating or reducing fabrication defects. For example, the fabrication method to form those conductive features may include plating. The uniform pattern density can effectively improve plating uniformity and reduce plating defect. The dimensions, such width and pitch, of the metal bars 406 in the SRG region 443 provide more freedom to tune the pattern density and can be used to tune the pattern density of the SRG regions 443. For example, increasing the width and decreasing the pitch of the metal bars 406 can increase the pattern density. The SRG region 443 is described for illustration. The implementation of the metal bars 406 are also applicable to the SRG regions 445 and 447. For example, the metal bars 406 may be added to the SRG regions 445 and 447 as well with similar or alternatively different configuration to provide more freedom to tune the pattern density.

Figure 4:
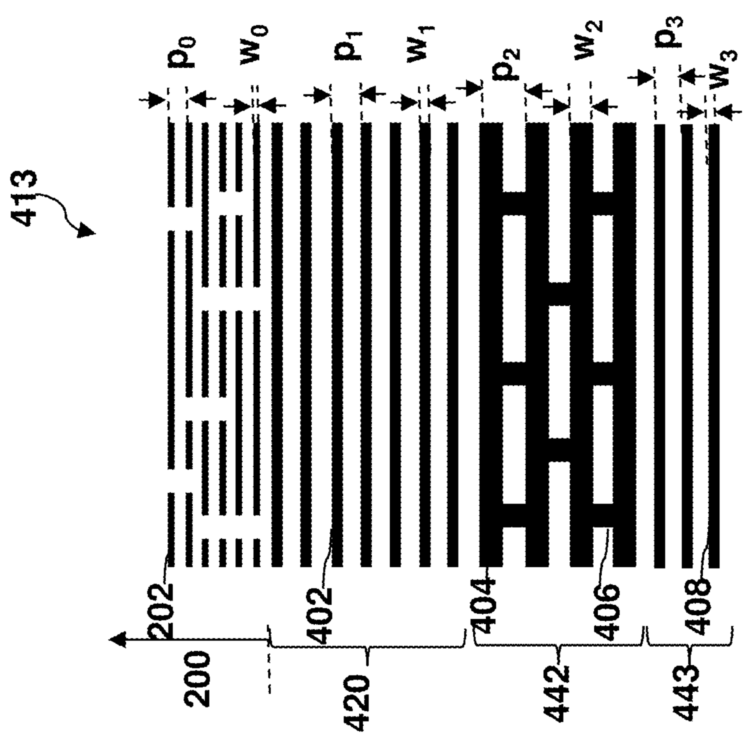
FIGS. 4 and 11 are enlarged top plan views of area 413 in FIGS. 2 and 10, respectively, according to various aspects of the present disclosure.

FIG. 4 is an enlarged top plan view of area 413 shown in FIG. 2. The transition lines 402 are lengthwise parallel to the conductive lines 202 in the circuit region 200 and lengthwise parallel to the conductive rings 404 and PERs 408 in the section BC of the seal ring region 400. The conductive lines 202 in the circuit region 200, the transition lines 402 in the transition region 420, the conductive rings 404 in the sealing region 440, and the PERs 408 in the SRG region 443 have line width $w_0$, $w_1$, $w_2$, and $w_3$, respectively. Similarly, the conductive lines 202 in the circuit region 200, the transition lines 402 in the transition region 420, the conductive rings 404 in the sealing region 440 and the PERs 408 in the SRG region 443 have line pitches $p_0$, $p_1$, $p_2$, and $p_3$, respectively. In the present embodiments, the line width $w_1$ is greater than the line width $w_0$ and less than the line width $w_2$. Similarly, the line pitch $p_1$ is greater than the line pitch $p_0$ and less than the line pitch $p_2$. In addition, the transition region 420 has a pattern density $d_1$ that is greater than a pattern density do of the circuit region 200 and less than a pattern density $d_2$ in the sealing region 440. The transition lines 402 are the same as the PERs 408 except each of the PERs forms a closed loop around the circuit region 200, while the transition lines 402 are straight lines. The transition lines 402 in the transition region 420 are such configured (in line widths, line pitches, and pattern densities, etc.) to alleviate the issues in subsequent processes caused by the differences between the circuit region and the sealing region. The transition region 420 provides buffer between the circuit region 200 and the sealing region 440 to avoid issues that may happen otherwise, such as over etching of the components in the sealing region due to the greater line widths and line pitches, and/or the dishing issue due to the differences in the pattern density.

Figure 5:
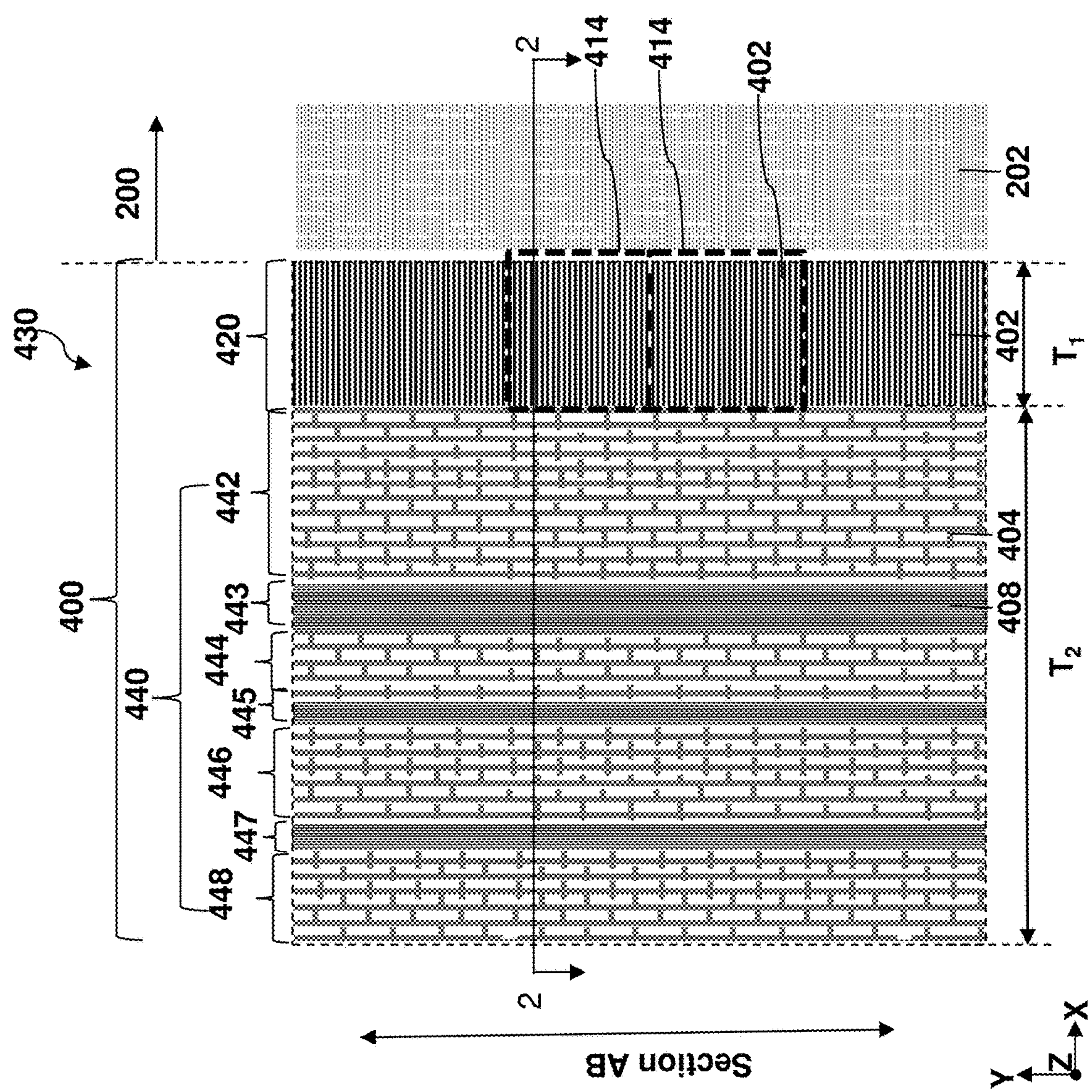
FIG. 5 is an enlarged top plan view of area 430 in FIG. 1, according to various aspects of the present disclosure.

FIG. 5 is an enlarged top plan view of the area 430 shown in FIG. 1. The area 430 is selected from the section AB of the seal ring region 400 for illustration purposes. The same principles apply to the section CD equally except that the section CD is a mirrored image of the section AB along a center line of the semiconductor structure 100 along y direction. The configurations of circuit region 200, the sealing region 440, and the transition region 420 are the same as discussed in accordance with FIGS. 2-4 except what are explicitly discussed below. In the depicted embodiments, the transition region 420 in the section AB of the seal ring region 400 includes rectangular units 414 aligned along y direction. Each of the rectangular units 414 includes transition lines 402 substantially parallel to the conductive lines 202 in the circuit region 200. The transition lines 402 are aligned along y direction in section AB of the seal ring region 400. In other words, ends of the transition lines 402 proximal the seal ring 442 have a same distance from the seal ring 442. Different from the section BC of the sealing region 440, the transition lines 402 in the section AB of the seal ring region 400 are disposed perpendicular to the conductive rings 404 and 408. Particularly, conductive lines 202 and transition lines 402 are oriented in the same direction while metal rings 404 and PERs 408 change the orientations so to be in parallel with the corresponding edge of the chip.

Figure 6:
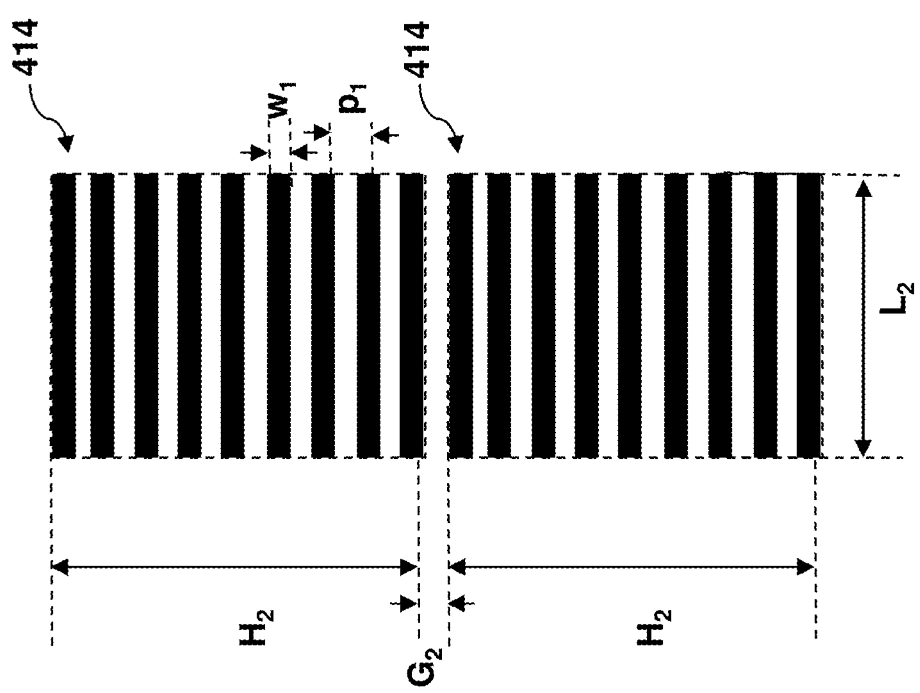
FIG. 6 is an enlarged top plan view of area 414 in FIG. 5, according to various aspects of the present disclosure.

Referring to FIG. 6, the rectangular units 414 may be of various sizes and of various length to width ratios. In the present embodiments, the rectangular units 414 have uniform size and uniform length to width ratio defined by a length $L_2$ and a height $H_2$, where the length $L_2$ equals to the height $H_1$ and the height $H_2$ equals to the lengths $L_1$. The gap between the rectangular units 414 may be the same or vary from each other. In the present embodiments, the rectangular units 414 have uniform gaps $G_2$ therebetween, wherein the gap $G_2$ equals to the pitch $p_1$. The line widths and the line pitches in each of the rectangular units 414 may vary and may be the same or different from the line width $w_1$ and the line pitch $p_1$. In the present embodiments, the transition lines 402 in the rectangular units 414 have the line width $w_1$ and the line pitch $p_1$ the same as the transition lines 402 in the section BC. As such, the thickness $T_1$ of the transition region 420 in the section AB is the same as in the section BC ($L_2$ equals $H_1$), and therefore providing smooth transition from the circuit region 200 to the seal ring region 400 around the entire periphery of the circuit region 200.

Figure 7A:
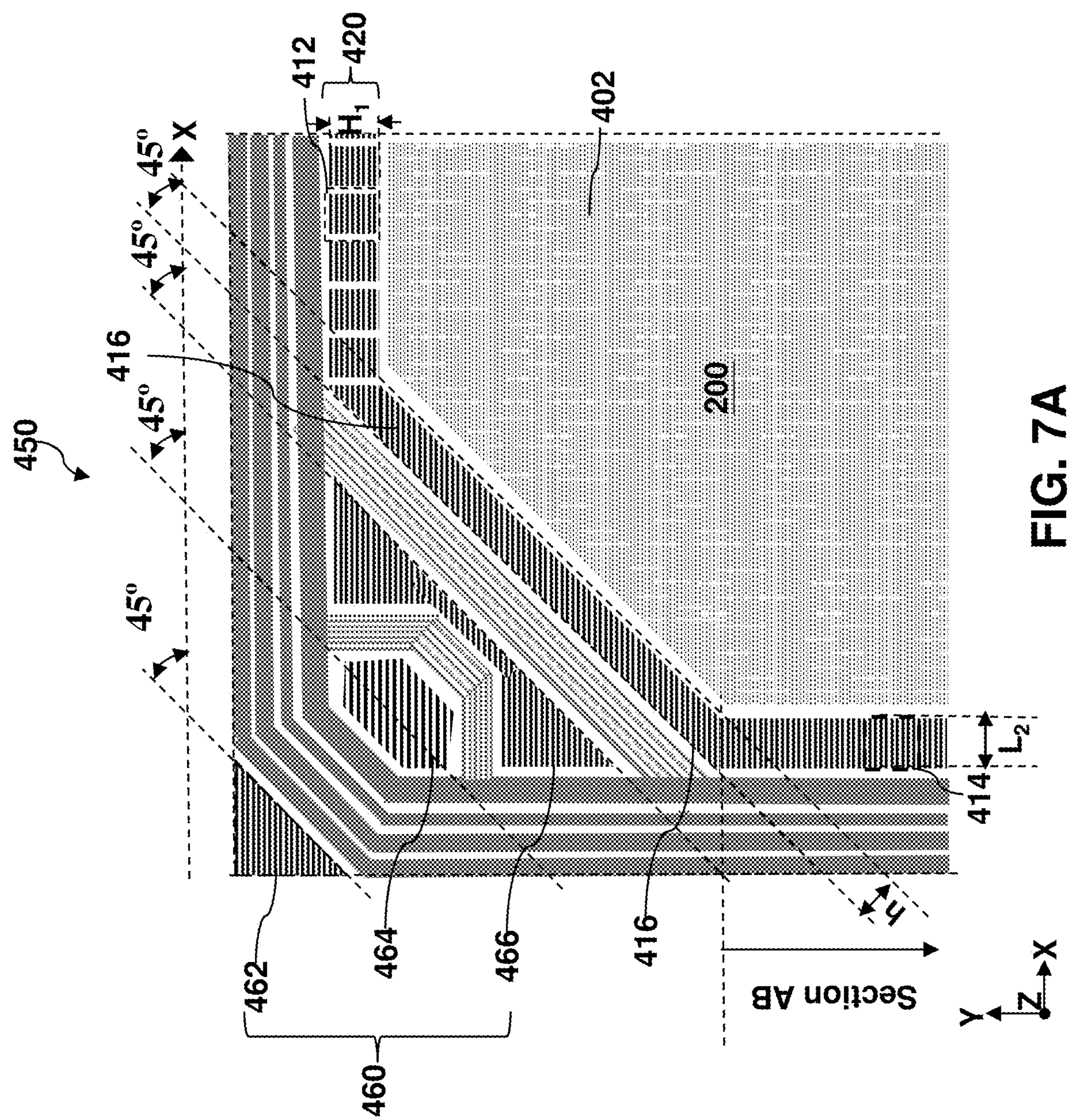
FIGS. 7A, 12, and 13 are enlarged top plan views of area 450 in FIG. 1, according to various aspects of the present disclosure.

FIG. 7A is an enlarged top plan view of the area 450 in FIG. 1. The area 450 is selected from the corner A of the seal ring region 400 for illustration purposes. The same principles apply to the corners B, C and D equally, except that the corners B, C and D are mirrored images of the corner A along a center line along x direction, a diagonal line along BD direction, and a center line along y direction, respectively.

The transition region 420 in the area 450 includes a corner unit 416. The corner unit 416 may be in various suitable shapes. In the present embodiments, the corner unit 416 is a right trapezoid shape. The two parallel edges of the right trapezoid each forms a 45° angle with x direction. One of the non-parallel edge proximal the section AB is substantially parallel to the transition lines. The other non-parallel edge proximal the section AD is substantially perpendicular to the transition lines. A length of each non-parallel edge equals to the height $H_1$ and the width $L_2$. A height h of the right trapezoid shape, which is also the thickness T of the corner unit 416, is less than the height $H_1$ and the width $L_2$. The corner unit 416 may include transition lines 402 oriented lengthwise along x direction (parallel to other transition lines 402 in the transition region) of various width, length, and line pitches. In the present embodiments, the transition lines 402 have a uniform width $w_1$ and the uniform line pitch $p_1$. As such, the transition region 420 has uniform properties, such as line length, line width, thickness, and pattern density at the corner A. The uniform properties of the transition region 420 improve the issues of over etching or dishing in subsequent processes.

Still referring to FIG. 7A, the seal ring region 400 includes four corner regions 460 at the corner A, B, C, and D of the chip. Each of the corner region 460 includes an outer corner region 462, an inner corner region 464, and an inner corner region 466. The outer corner region 462 is a right triangle shape with two of the right-angle edges along the edges of the seal ring region 400. The inner corner region 464 is a hexagon shape, the longest diagonal line of which forms a 45° angle with the x direction. The inner corner region 466 is an irregular shape formed by connecting two right triangle shapes with a rectangular shape. The hypotenuses of the two right triangles and a long edge of the rectangle are disposed along a straight line having a 45° angle with the x direction. The two right triangles and the rectangle are disposed on the same side of the 45° straight line. The outer corner region 462, the inner corner region 464, and the inner corner region 466 may include conductive lines of various line widths and line pitches. The conductive lines may be disposed in various proper directions. In the present embodiments, the outer corner region 462, the inner corner region 464, and the inner corner region 466 each includes metal lines parallel to the transition lines 402. The metal lines in the corner regions 460 have uniform line width $w_1$ and uniform line pitch $p_1$. The corner regions 460 are such configured to enhance the processability and the strength of the seal ring region 400.

Figure 7B:
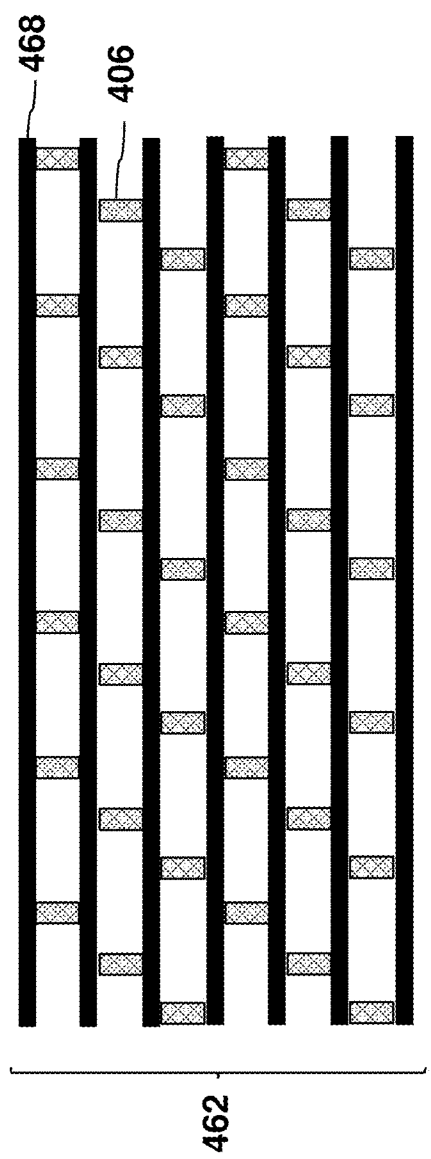
FIG. 7B is an enlarged top plan view of a portion of the semiconductor structure in FIG. 7A, according to various aspects of the present disclosure.

FIG. 7B is an enlarged top plan view of a corner region (462, 464 or 466) of the semiconductor structure shown in FIG. 7A, constructed according to some embodiments. As illustrated in FIG. 7B, the corner region 462 includes conductive lines (metal lines) 468 and further includes metal bars 406 added among the metal lines 468. For examples, the metal bars 406 are configured to connect adjacent metal lines 468. The metal bars 406 may be configured such that metal bars 406 in adjacent rows are interdigitated or alternatively aligned. Similarly, the metal bars 406 added in the corner region 462 can effectively tune the pattern density to improve pattern uniformity, thereby eliminating or reducing fabrication defects. The dimensions, such width and pitch, of the metal bars 406 in the corner region 462 provide more freedom to tune the pattern density and can be used to tune the pattern density of the corner regions. For example, increasing the width and decreasing the pitch of the metal bars 406 can increase the pattern density. The corner region 462 is described for illustration. the implementation of the metal bars 406 are also applicable to the corner regions 464 and 466. For example, the metal bars 406 may be added to the corner regions 464 and 466 as well with similar or alternatively different configuration.

Figure 8:
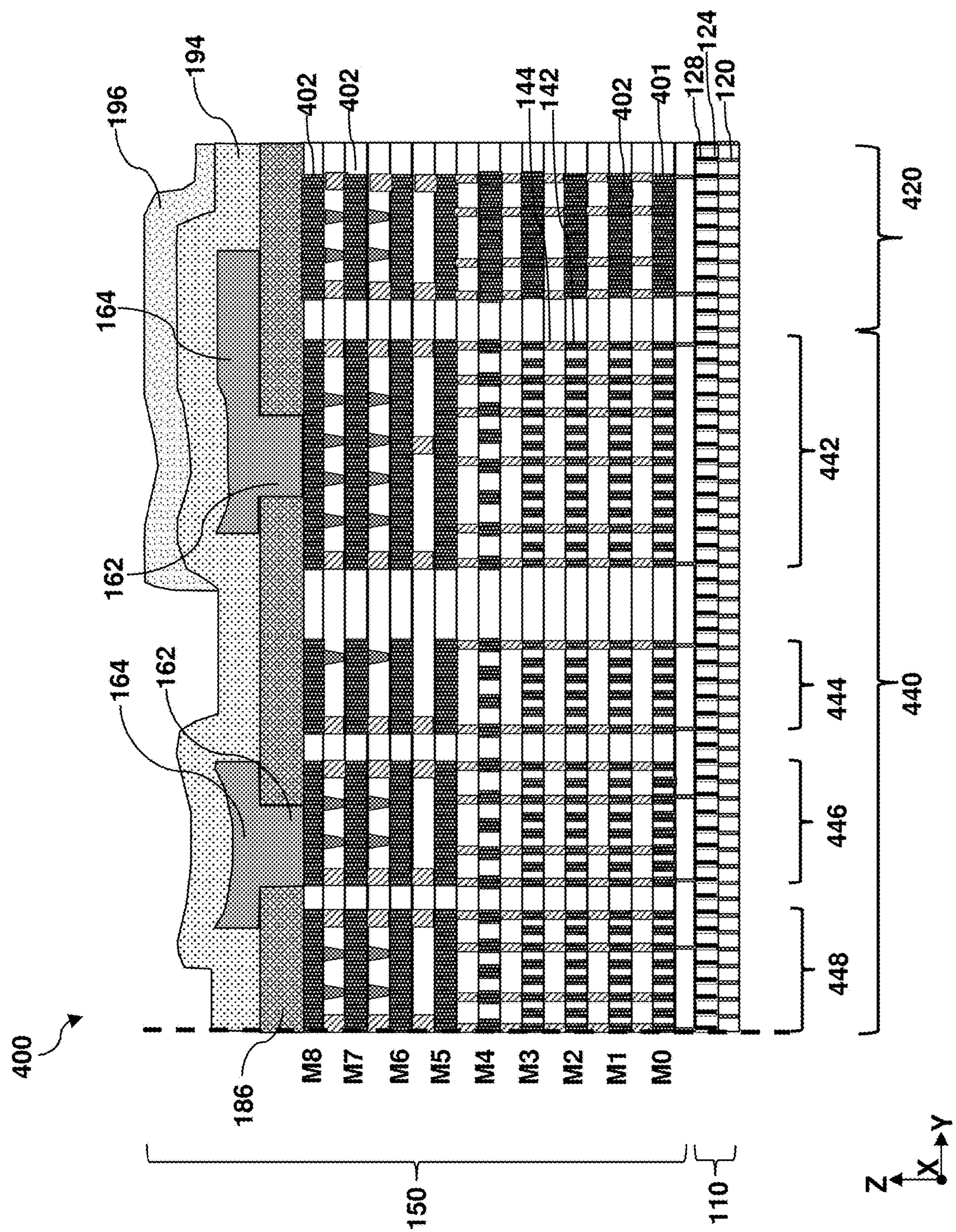
FIG. 8 is a cross-sectional view of the semiconductor structure in FIG. 1 along the line "1-1", according to various aspects of the present disclosure.

FIG. 8 is a cross-sectional view of the seal ring region 400 along the line "1-1" in FIG. 1. The line "1-1" cut through a transition line 402 along the lengthwise direction. The seal ring region 400 includes a substrate 110 and a seal ring structure 150 disposed over the substrate 110. The seal ring structure 150 vertically extends from the substrate, through the interconnect structure, and up to the passivation layer to provide proper protection to the circuit in the circuit region 200. However, the seal ring structure 150 in each region is configured differently as described below. The substrate 110 includes active regions 120, gate structures 124 and source/drain contacts 128. Each of the gate structures 124 is disposed over a channel region of an active region 120. Each of the source/drain contacts 128 is disposed over a source/drain feature that is disposed over a source/drain region of an active region. The seal ring region 400 may include multiple metal layers, such as 9 to 14 metal layers, embedded in intermetal dielectric (IMD) layers. In the depicted embodiments, the seal ring region 400 includes nine metal layers—a first metal layer M0, a second metal layer M1, a third metal layer M2, a fourth metal layer M3, a fifth metal layer M4, a sixth metal layer M5, a seventh metal layer M6, an eighth metal layer M7, and a ninth metal layer M8. In the sealing region 440, each of the metal layers include one or more metal rings 142 and one or more via rings 144. A via ring is disposed vertically between two metal rings in two adjacent metal layers and connects the two adjacent metal layers. The metal rings and the via rings extends lengthwise completely around in a closed loop that surrounds the circuit region 200 (FIG. 1). The seal ring structure 150 in the seal ring region 400 protects the circuit region 200 from damages such as dusts, moisture, and/or mechanical stress. Although not depicted in FIG. 8, PERs may be inserted SRG regions between the seal rings 442, 444, 446, and 448 in some embodiments such as the ones depicted in FIGS. 2, 3A and 5.

FIG. 8 depicts a cross-sectional view of a transition line 402 cut along the lengthwise direction. The line "1-1" cuts the transition lines 402 along a perpendicular line of the transition lines 402 in a rectangular unit 410. Same as the sealing region 440, the transition line 402 in the transition region 420 are also disposed in all the metal layers from M0 to M8, each of which includes a transition lines 402 and one or more vias 401. Although the cross-sectional view of the transition region 420 is very similar to that of the sealing region 440, they are different in many ways. For example, the seal rings 442, 444, 446, and 448 in the sealing region 440 continuously extend around the circuit region 200 and particularly oriented lengthwise along y direction in the section AB of the seal ring region 400, while none of the transition lines 402 and the vias 401 in the transition region 420 form ring shape. A conductive structure in a ring shape means that the conductive feature continuously extends around the circuit region. Instead, the transition lines 402 are straight conductive lines parallel to each other and disposed evenly in the transition region 420. The transition region 420 extends around the entire circuit region 200 and forms a loop from a top view (FIG. 1).

In some embodiments, the substrate 110 may be a bulk silicon (Si) substrate. Alternatively, substrate 110 may include elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, the substrate 110 includes one or more group III-V materials, one or more group II-VI materials, or combinations thereof. In still some instances, the substrate 110 is a semiconductor-on-insulator substrate, such as a silicon-on-insulator (SOI) substrate, a silicon germanium-on-insulator (SGOI) substrate, or a germanium-on-insulator (GeOI) substrate. In still some embodiments, the substrate 110 may be diamond substrate or a sapphire substrate.

The substrate 110 includes various semiconductor structures, such as active regions, gate structures disposed over channel regions of the active regions, source/drain features disposed over source/drain regions of the active regions, source/drain contacts disposed over source/drain features, and gate contact vias disposed over the gate structures, and the interconnect structure disposed thereover to couple various components into an integrated circuit. The active regions may include silicon (Si) or other suitable semiconductor material, such as germanium (Ge) or silicon germanium (SiGe). Each of the segmented gate structures includes a gate dielectric layer and a gate electrode layer over the gate dielectric layer. In some embodiments, the gate dielectric layer includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr) $TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The IMD layer may include materials such as tetraethylorthosilicate (TEOS) oxide, un-doped silicate glass, or doped silicon oxide, borophosphosilicate glass (BPSG), fused silica glass (FSG), phosphosilicate glass (PSG), boron doped silicon glass (BSG), silicon oxycarbide, and/or other suitable dielectric materials, deposited by CVD, flowable CVD (FCVD), other suitable method or a combination thereof.

The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAIN), tantalum nitride (TaN), tantalum aluminum (TaAl), tantalum aluminum nitride (TaAIN), tantalum aluminum carbide (TaAIC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed using ALD, PVD, CVD, e-beam evaporation, or other suitable process.

Source/drain features may include silicon (Si) doped with an n-type dopant, such as phosphorus (P) or arsenic (As) or silicon germanium (SiGe) doped with a p-type dopant, such as boron (B) or boron difluoride ($BF_2$). The sourced/drain contacts may include a silicide layer, a metal fill layer disposed over the silicide layer, and a barrier layer to separate the metal fill layer from the IMD layer. The barrier layer may include titanium nitride or tantalum nitride and functions to prevent electro-migration in the metal fill layer. The silicide layer may include titanium silicide, tantalum silicide, cobalt silicide, nickel silicide, or tungsten silicide. The silicide layer is disposed at the interface between the metal fil layer and the source/drain features to reduce contact resistance. The metal fill layer may include ruthenium (Ru), copper (Cu), nickel (Ni), cobalt (Co), tungsten (W), or other suitable metal material.

The seal ring structure 150 further includes a first passivation layer 186 disposed over the topmost metal layer (e.g., M8), via rings 162 embedded in the first passivation layer 186, contact pad ring 164 disposed over the first passivation layer 186 and the contact via rings 162, a second passivation layer 194 disposed over the contact pad rings 164 and the first passivation layer 186, and a polymer layer 196 over the second passivation layer 194. The contact via ring 162 vertically extends through the first passivation layer 186 to couple to one of the topmost metal lines in the topmost metal layer. The contact pad rings 164 and the contact via rings 162 may be formed together by a dual damascene process that further includes forming dual damascene openings; depositing the metal fill layer in the dual damascene openings; and performing a chemical mechanical polishing (CMP) process. In these embodiments, the contact pad ring 164 and the underlying contact via ring 162 are continuous without an observable interface. The first passivation layer 186, the via rings 162, the contact pad ring 164, the second passivation layer 194, and the polymer layer 196 each extends around the circuit region 200 to form a closed loop.

Figure 9:
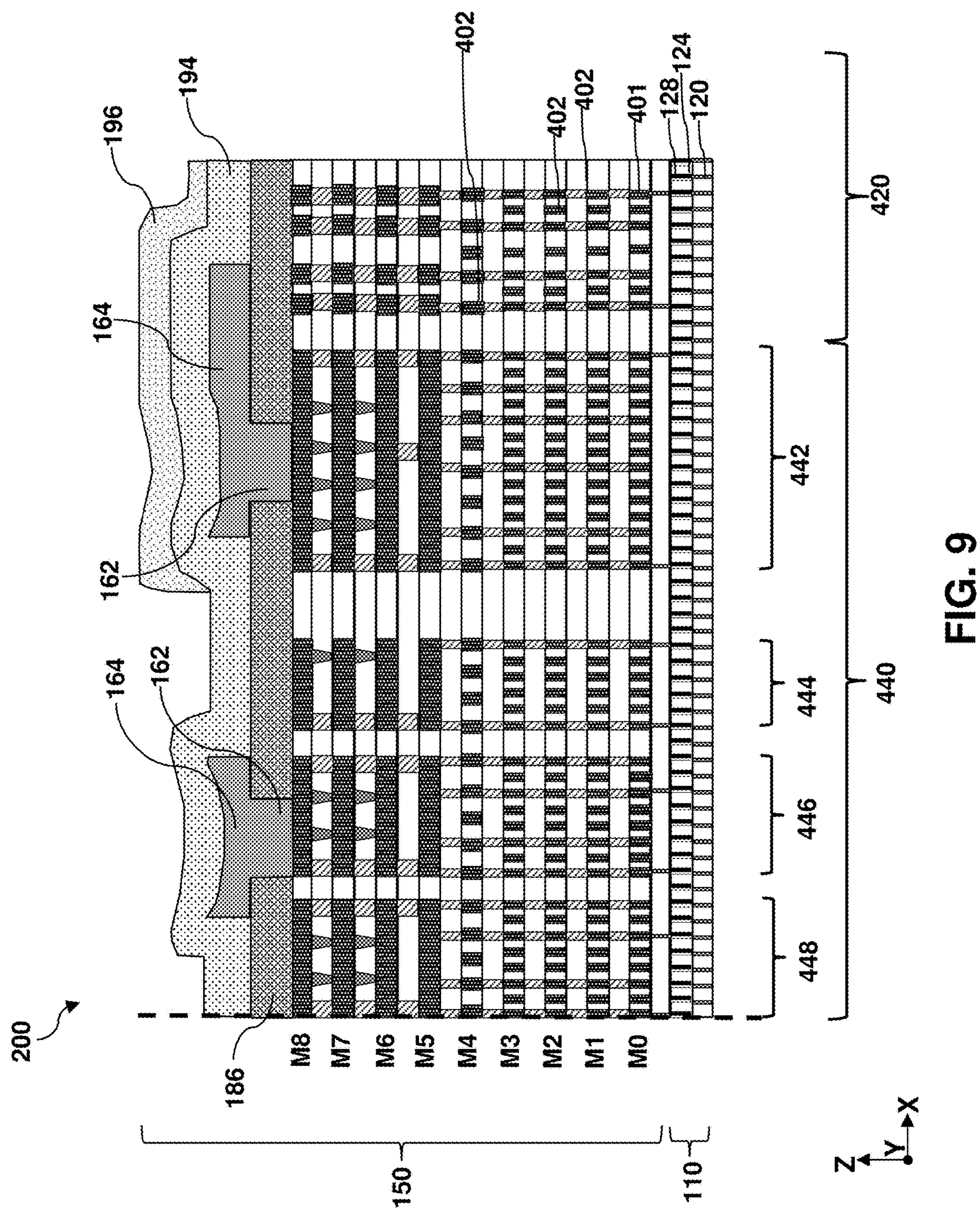
FIG. 9 is a cross-sectional view of the semiconductor structure in FIG. 1 along the line "2-2", according to various aspects of the present disclosure.

FIG. 9 is a cross-sectional view of the seal ring region 400 along the line "2-2" in FIG. 1. The line "2-2" cuts the transition lines 402 along a perpendicular line of the transition lines 402 in a rectangular unit 430. In the depicted embodiment, the numbers of the transition lines 402 included in the rectangular unit 430 gradually decrease from the bottommost metal layer to the topmost metal layer. For example, the rectangular unit 430 includes seven metal lines 402 in each of the metal layers M0, M1, M2, and M3, five metal lines 402 in the metal layer M4, and four metal lines 402 in the metal layer M5, M6, M7, and M8. Furthermore, the dimensions, such as width and pitches of the transition lines 402 increase from the bottommost metal layer to the topmost metal layer, according to some embodiments. Similarly, the circuit region 200 includes bonding pads and redistribution layer (RDL) formed in the passivation layers. In some embodiments, the contact pad rings 164 and the contact vias ring 162 in the seal ring region 400 may be simultaneously formed with bonding pads and redistribution layer (RDL) in the circuit region 200 by depositing a metal fill layer in a dual damascene process.

In some embodiments, the first passivation layer 186 and the second passivation layer 194 may include undoped silicate glass (USG), silicon nitride, silicon oxide, or silicon oxynitride. The contact via rings 162 and the contact pad ring 164 may include aluminum (Al), copper (Cu), aluminum-copper (Al—Cu), a suitable metal, or a suitable metal alloy. The polymer layer 196 may include epoxy, polyimide (PI), benzocyclobutene (BCB), or polybenzoxazole (PBO). In one embodiment, the polymer layer 196 includes polyimide (PI).

Figure 10:
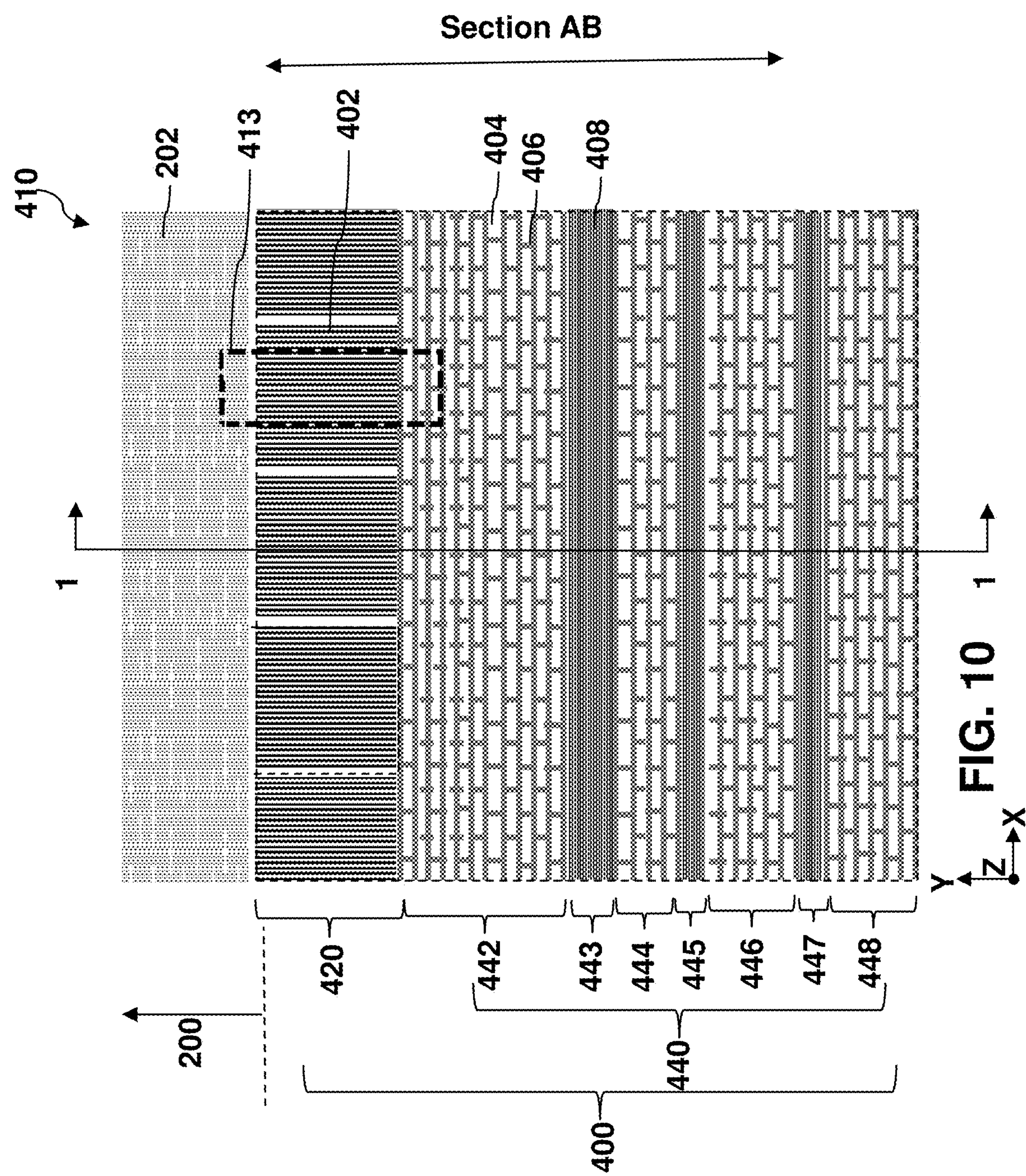
Figure 11:
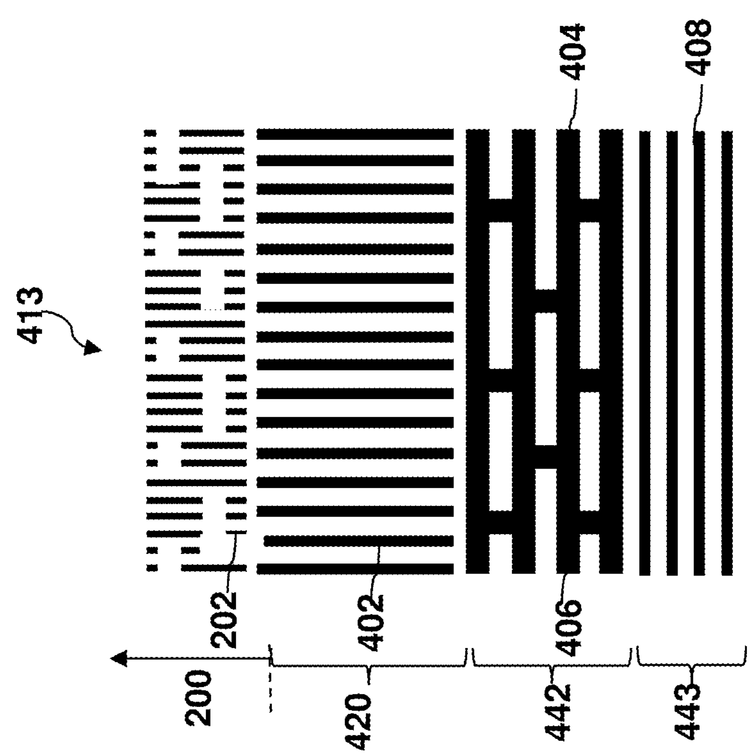

FIG. 10 is an enlarged top plan view of the area 410 in FIG. 1. FIG. 11 is an enlarged top plan views of the area 413 in FIG. 10 (or FIG. 2). FIGS. 10 and 11 illustrate alternative embodiments of the ones depicted in FIGS. 2 and 3. For example, FIGS. 2 and 3 depict the area 410 in the metal layer M8, M6, M4, M2, or M0, while the FIGS. 10 and 11 depict the area 410 in the metal layer M7, M5, M3, or M1. The metal layer M8 and M7 are used for illustration purposes hereafter. The configurations of the seal ring region 400 in metal layer M7 are substantially the same as the configurations in the metal layer M8, except the aspects explicitly discussed below. The conductive lines 202 in the metal layer M7 and the conductive lines 202 in the metal layer M8 are substantially perpendicular. The transition lines 402 in the metal layer M7 are oriented in parallel with the conductive lines 202 in the metal layer M7; and the transition lines 402 in the metal layer M8 are oriented in parallel with the conductive lines 202 in the metal layer M8 to provide proper transition from the circuit region 200 to the seal ring region 400. In contrast, the seal rings, such as 442, 444, 446 and 448, keep their orientations through various metal layers, being in parallel with the adjacent edge of the chip. For example, segments of the seal rings associated with the chip edge AB are in parallel with the chip edge AB, segments of the sealing rings associated with the chip edge BC are in parallel with the chip edge BC, and so on.

Particularly, the transition lines 402 as well as the conductive lines 202 in the metal layer M7 are disposed lengthwise along y direction. The transition lines 402 and the conductive lines 202 in the metal layer M7 are substantially perpendicular with the transition lines 402 and the conductive lines 202 in the metal layer M8. The conductive rings 404 in the metal layer M7 are parallel to the conductive rings 404 in the metal layer M8. In addition, the transition lines 402 and the conductive lines 202 are parallel to the metal rings 404 and 408 in the section BC of the metal layer M8 (FIG. 2), while the transition lines 402 and the conductive lines 202 are perpendicular to the metal rings 404 and 408 in the section BC of the metal layer M7 (FIG. 10). In some embodiments, a line width of the transition lines 402 in metal layer M7 is less than the line width $w_1$ of the transition lines 402 in metal layer M8. Similarly, a line pitch of the transition lines 402 is less than the line pitch $p_1$.

Figure 12:
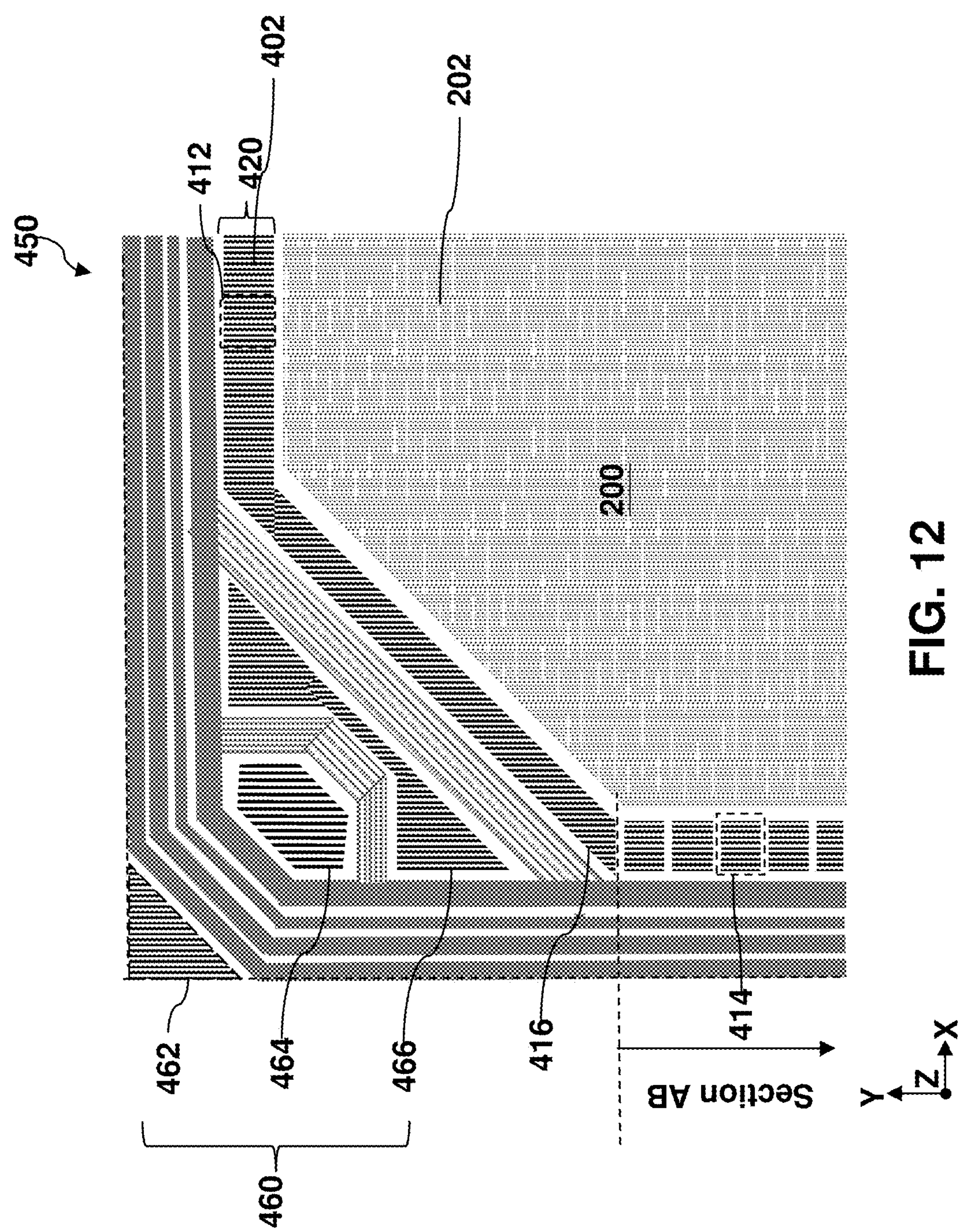

FIG. 12 is an enlarged top plan view of the area 450 in FIG. 1, illustrating an alternative embodiment to that depicted in FIG. 7A. For example, FIG. 7A depicts the area 450 in the metal layer M8, M6, M4, M2, or M0, while the FIG. 12 depicts the area 450 in the metal layer M7, M5, M3, or M1. The metal layer M8 and M7 are used for illustration purposes hereafter. For example, FIG. 7A depicts the area 450 in the metal layer M8 while the FIG. 12 depicts the area 450 in the metal layer M7 adjacent to the metal layer M8. The configurations of the seal ring region 400 in metal layer M7 are the same as the configurations in the metal layer M8, except the aspects explicitly discussed below. The transition lines 402 as well as the conductive lines 202 in the metal layer M7 are disposed lengthwise along y direction, which is substantially perpendicular to the transition lines 402 and the conductive lines 202 in the metal layer M8. The conductive lines in the corner region 462, 464, and 466 in the metal layer M7 are disposed lengthwise along y direction, which is parallel to the transition lines 402 in metal layer M7 and perpendicular to the conductive lines in the corner regions of the metal layer M8.

Figure 13:
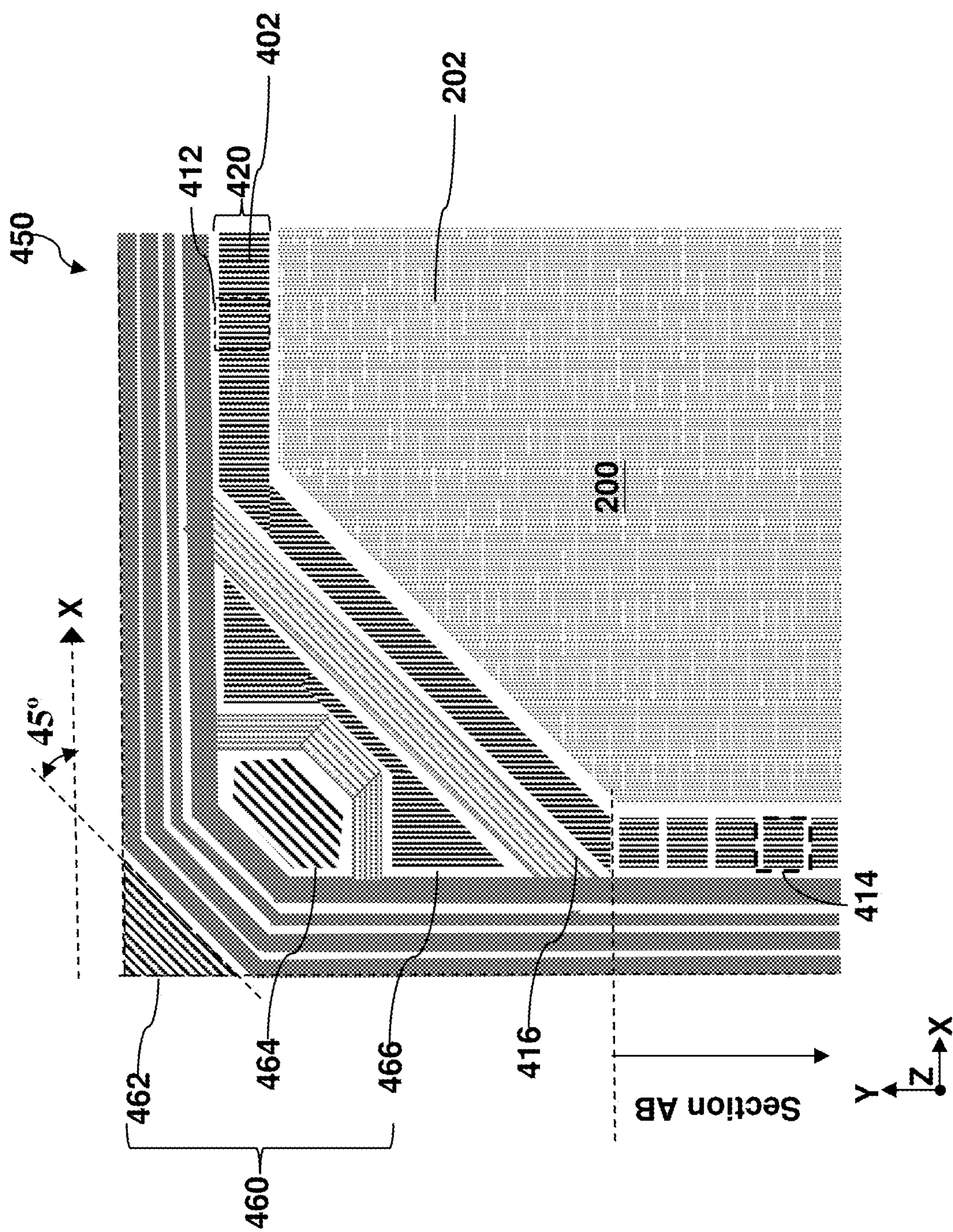

FIG. 13 is an enlarged top plan view of the area 450 in FIG. 1, illustrating an alternative embodiment of that depicted in FIG. 12. For example, FIG. 13 depicts the area 450 in a metal layer different from the metal layer depicted in FIG. 12. The configurations of the area 450 in FIG. 13 are substantially the same as the configurations depicted in FIG. 12, except the aspects explicitly discussed below. As depicted in FIG. 13, the metal lines in the corner regions 462 and 464, and 466 may be disposed along different directions. For example, the metal lines in the corner regions 462 and 464 are disposed along a direction that forms a 45° angle with x direction, while the conductive lines in the corner region 466 are disposed parallel to the transition lines 402. Such configurations provide process flexibility.

Figure 14:
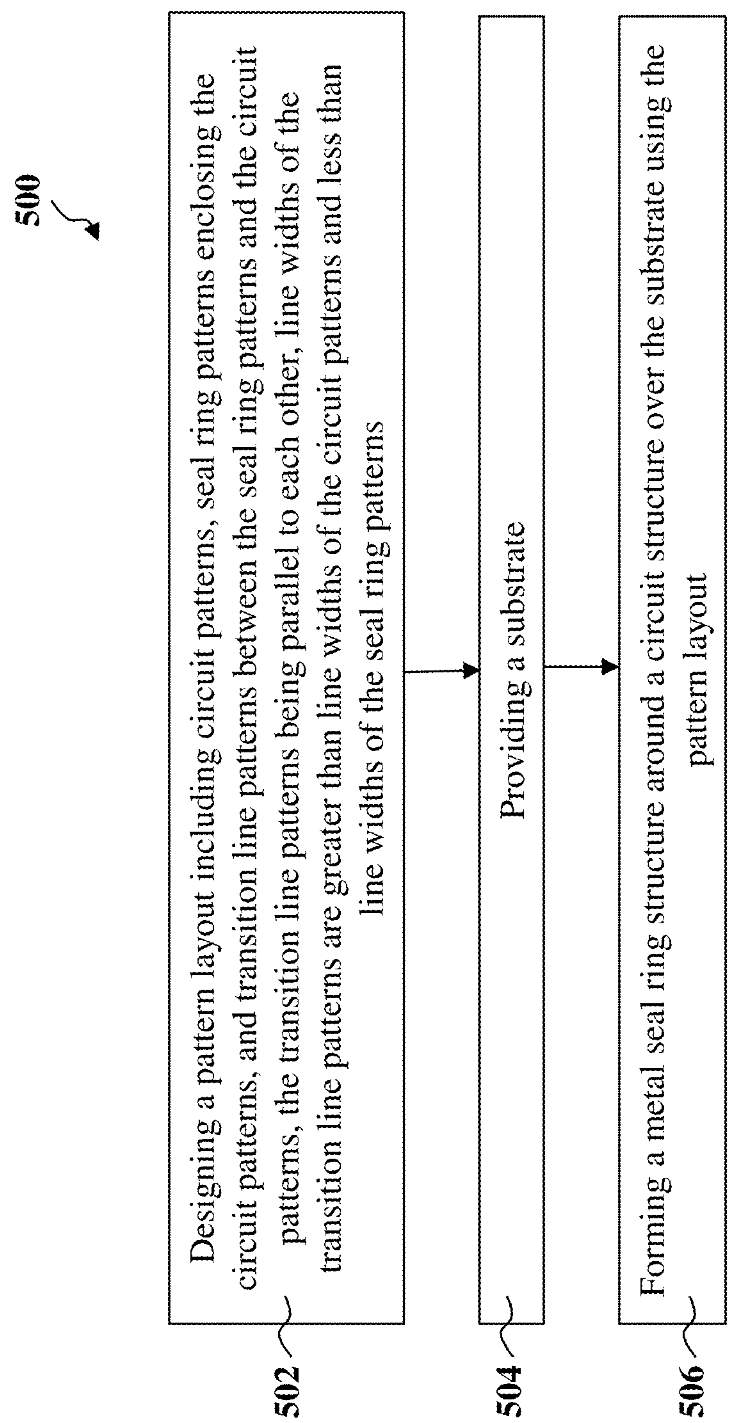
FIG. 14 is a flowchart of a method making the semiconductor structure in FIG. 1, according to various aspects of the present disclosure.

FIG. 14 is a method 500 of fabricating the semiconductor structure 100 in FIG. 1. The method 500 designs a pattern layout including conductive features (simply circuit patterns, such as the conducive lines 202) in the circuit region 200, seal rings (simply seal ring patterns, such as the metal rings 404) in the sealing region 440 enclosing the circuit patterns, and transition lines 402 (simply transition line patterns) in the transition region 420 between the seal ring patterns and the circuit patterns. The layout patterns reflect the configurations discussed above in accordance with FIGS. 1-13. For example, the transition line patterns are parallel to each other. In another example, line widths of the transition line patterns are greater than line widths of the circuit patterns and less than line widths of the seal ring patterns. The method 500 subsequently provides (or being provided with) a substrate 110. Thereafter, the method 500 forms the semiconductor structure 100 discussed above in accordance with FIGS. 1-13 using the pattern layout.

Although not intended to be limiting, embodiments of the present disclosure provide one or more of the following advantages. For example, embodiments of the present disclosure provide a seal ring region enclosing a circuit region. The seal ring region includes a sealing region and a transition region between the sealing region and the circuit region. The transition region includes straight conductive lines parallel to an edge of the seal ring region and disposed around the circuit region. The transition region smooths the transition from the circuit region of a higher pattern density to a seal ring region of a low pattern density. Therefore, reducing the over etching or dishing issues during the subsequent processes. In some embodiments, all transition lines in the transition region are parallel to the conductive lines in the circuit region. In some embodiments, each of the transition lines has a width greater than widths of the conductive lines in the circuit region and less than widths of the conductive lines in the seal rings. In some embodiments, first transition lines in the transition region of a first metal layer are substantially perpendicular to second transition lines in the transition region of a second metal layer.

In one example aspect, the present disclosure is directed to a semiconductor structure. The semiconductor structure includes a substrate; a seal ring region around a circuit region over the substrate, wherein the seal ring region includes a sealing region and a transition region, and wherein the transition region is disposed between the sealing region and the circuit region; and a stack of metal layers disposed over the circuit region, the transition region and the sealing region. A metal layer of the stack of metal layers includes metal seal rings disposed in the sealing region including a first section along a first direction and a second section along a second direction, wherein the second direction is substantially perpendicular to the first direction; and metal transition lines disposed in the transition region along the first section and the second section, wherein the metal transition lines are oriented lengthwise along the first direction.

In another example aspect, the present disclosure is directed to a semiconductor structure. The semiconductor structure includes a semiconductor substrate; and a horizontal conducting layer stacked over the semiconductor substrate along a vertical direction. The horizontal conducting layer includes a seal ring region encompassing a circuit region. The horizontal conducting layer includes a conductive seal ring having a first edge along a first horizontal direction and a second edge along a second horizontal direction, wherein the first horizontal direction is different from the second horizontal direction; and conductive transition lines disposed around an inner circumference of the conductive seal ring, wherein the conductive transition lines are substantially parallel to the first horizontal direction, and wherein a width of each transition lines is less than a width of the first edge and the second edge.

In yet another example aspect, the present disclosure is directed to a method of forming a semiconductor structure. The method includes designing a pattern layout that includes seal ring patterns enclosing circuit patterns, wherein each of the seal ring patterns forms an octagon shape including first edges along a first direction, second edges along a second direction perpendicular with the first direction, and corner edges connecting the first edges and the second edges, and transition line patterns between the seal ring patterns and the circuit patterns. Each of the transition line patterns are disposed parallel to the first edges. The transition line patterns form a ring shape around the circuit patterns. Each of the transition line patterns has a first width and each of the seal ring patterns has a second width. The first width is less than a second width. The method further includes providing a substrate; and forming a metal seal ring structure around a circuit structure over the substrate using the pattern layout.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a substrate;

a seal ring region around a circuit region over the substrate, wherein the seal ring region includes a sealing region and a transition region, and wherein the transition region is disposed between the sealing region and the circuit region; and a stack of metal layers disposed over the circuit region, the transition region and the sealing region, wherein a metal layer of the stack of metal layers includes:

metal rings disposed in the sealing region including a first section along a first direction and a second section along a second direction, wherein the second direction is substantially perpendicular to the first direction;

metal transition lines disposed in the transition region along the first section and the second section, wherein the metal transition lines are oriented lengthwise along the first direction; and metal lines disposed in the circuit region and oriented parallel to the metal transition lines.

2. The semiconductor structure of claim 1, wherein a portion of the metal layer within the transition region forms a ring shape enclosing the circuit region, and wherein the ring shape extends substantially parallel to the metal rings.

3. The semiconductor structure of claim 1, wherein a pattern density of the metal transition lines is greater than a pattern density of the metal lines and less than a pattern density of the metal rings.

4. The semiconductor structure of claim 1, further comprising:

a corner edge connecting the first section and the second section along a third direction, wherein the metal transition lines are disposed in rectangular units and corner units, wherein the rectangular units are disposed apart from each other along the first section and the second section, and wherein the corner units are disposed along the corner edge, and wherein the metal transition lines in the rectangular units disposed along the first section have a first length, and wherein the metal transition lines disposed in the corner units have a second length different from the first length.

5. The semiconductor structure of claim 1, wherein the metal transition lines along the second section have substantially a same length.

6. The semiconductor structure of claim 1, wherein the metal transition lines along the second section have first ends proximal the second section and second ends distal the second section, wherein the first ends are disposed substantially along a straight line.

7. The semiconductor structure of claim 1, wherein the metal transition lines have a thickness greater than a thickness of the metal lines and less than a thickness of the metal rings.

8. The semiconductor structure of claim 1, wherein the metal layer further includes first metal bars connecting the metal rings.

9. The semiconductor structure of claim 8, further comprising second metal bars connecting the metal transition lines.

10. A semiconductor structure, comprising:

a semiconductor substrate; and a seal ring structure disposed on the semiconductor substrate to surround a circuit region, the seal ring structure and the circuit region create a stack of horizontal conducting layers, wherein one horizontal conducting layer of the stack includes:

a conductive seal ring having a first edge along a first horizontal direction and a second edge along a second horizontal direction, wherein the first horizontal direction is different from the second horizontal direction;

conductive transition lines disposed along an inner circumference of the conductive seal ring, wherein the conductive transition lines are substantially parallel to the first horizontal direction, and wherein a width of each transition lines is less than each of a width of the first edge and a width of the second edge; and conductive lines in the circuit region oriented lengthwise along the first horizontal direction.

11. The semiconductor structure of claim 10, further comprising a corner edge connecting the first edge and the second edge along a third direction, wherein the conductive transition lines are disposed in rectangular units and corner units, wherein the rectangular units are disposed apart from each other along the first edge and the second edge, and wherein the corner units are disposed along the corner edge.

12. The semiconductor structure of claim 11, wherein the conductive transition lines in the rectangular units and the corner units have a uniform width and a uniform pitch.

13. The semiconductor structure of claim 11, wherein the conductive transition lines in the rectangular units disposed along the first edge have a first length, and wherein the conductive transition lines disposed in the corner units have a second length different from the first length.

14. The semiconductor structure of claim 11, wherein a width of the rectangular units along the first edge of the conductive seal ring equals to a height of the rectangular units along the second edge of the conductive seal ring, and wherein the width is measured along the first horizontal direction and the height is measured along the second horizontal direction.

15. The semiconductor structure of claim 11, wherein the conductive transition lines have a thickness greater than a thickness of the conductive lines and less than a thickness of the conductive seal ring.

16. A semiconductor structure, comprising:

a semiconductor substrate; and a seal ring structure disposed on the semiconductor substrate to surround a circuit region and comprised a stack of horizontal conducting layers, wherein one horizontal conducting layer of the stack includes:

a conductive seal ring having a first edge along a first horizontal direction, a second edge along a second horizontal direction, and a corner edge connecting the first edge and the second edge along a third direction, wherein the first horizontal direction, the second horizontal direction and the third direction are different from each other; and conductive transition lines disposed along an inner circumference of the conductive seal ring, wherein the conductive transition lines are substantially parallel to the first horizontal direction, and wherein a width of each transition lines is less than a width of each of the first edge and the second edge, wherein the conductive transition lines are disposed in rectangular units and corner units, wherein the rectangular units are disposed apart from each other along the first edge and the second edge, wherein the conductive transition lines in the rectangular units disposed along the first edge have a first length, and wherein the conductive transition lines disposed in the corner units have a second length different from the first length.

17. The semiconductor structure of claim 16, wherein the corner units are disposed along the corner edge; and the conductive transition lines in the rectangular units and the corner units have a uniform width and a uniform pitch.

18. The semiconductor structure of claim 16, wherein a width of the rectangular units along the first edge of the conductive seal ring equals to a height of the rectangular units along the second edge of the conductive seal ring, wherein the width is measured along the first horizontal direction and the height is measured along the second horizontal direction.

19. The semiconductor structure of claim 16, wherein the horizontal conducting layer further includes metal bars connecting the conductive transition lines.

20. The semiconductor structure of claim 19, wherein the conductive transition lines include a first, second and third conductive transition lines;

the metal bars include a first subset and a second subset;

the first subset of the metal bars connect the first and second conductive transition lines;

the second subset of the metal bars connect the second and third conductive transition lines; and the first subset of the metal bars and the second subset of the metal bars are interdigitated along the first horizontal direction.

* * * * *